United States Patent [19]

Suplinskas et al.

[11] 4,315,968
[45] Feb. 16, 1982

[54] SILICON COATED SILICON CARBIDE FILAMENTS AND METHOD

[75] Inventors: Raymond J. Suplinskas, Haverhill; Thomas W. Henze, Lawrence, both of Mass.

[73] Assignee: Avco Corporation, Wilmington, Mass.

[21] Appl. No.: 118,954

[22] Filed: Feb. 6, 1980

[51] Int. Cl.³ .......................... B32B 9/00; D02G 3/00
[52] U.S. Cl. .................................. 428/367; 427/45.1; 427/249; 427/255; 427/255.2; 427/255.5; 427/402; 428/368; 428/391; 428/401
[58] Field of Search .................... 427/255, 45.1, 255.5, 427/402, 226, 225.2, 249, 255.4; 428/367, 215, 368, 401, 391, 538, 446

[56] References Cited

U.S. PATENT DOCUMENTS

| | | | |
|---|---|---|---|
| 976,207 | 11/1910 | Parker et al. | 428/367 |
| 3,035,325 | 5/1962 | Nicholson et al. | 427/255 |
| 3,200,009 | 8/1965 | Reuschel et al. | 427/255 |
| 3,335,049 | 8/1967 | Pultz | 428/367 |
| 3,501,336 | 3/1970 | Dyer et al. | 427/255 |
| 3,635,683 | 1/1972 | Harrison et al. | 427/255 |
| 3,652,348 | 3/1972 | Baum | 428/367 |
| 3,900,597 | 8/1975 | Chruma et al. | 427/255 |
| 4,068,037 | 1/1978 | Debolt et al. | 427/228 |

*Primary Examiner*—S. L. Childs
*Attorney, Agent, or Firm*—Abraham Ogman

[57] ABSTRACT

Silicon carbide filament is produced by overcoating a carbon monofilament core using continuous process vapor deposition. The deposition takes place by passing the carbon monofilament through a reactor into which gaseous sources of silicon and carbon are injected. At a deposition temperature of about 1300 C., a deposit of fine grained beta crystals of silicon carbide are formed. Application of a thin coating of silicon-rich silicon carbide on the surface of the filament both adds strength and provides a surface which is readily bonded to metals, glass and resin matrix materials during the forming of composite structures.

6 Claims, 4 Drawing Figures

SILICON COATED SILICON CARBIDE FILAMENTS AND METHOD

BACKGROUND OF THE INVENTION

Many composite materials are being reinforced with high strength, high modulus filaments such as boron or silicon carbide. The composite matrix materials provide high strength and stiffness while at the same time give reduced component weight.

U.S. Pat. No. 4,068,037 to DeBolt et al and assigned to the same assignee as this invention discloses means for making silicon carbide filament. In accordance with the DeBolt et al patent, a carbon filament is drawn from a supply reel and passed through a reactor chamber comprised generally of a closed tubular cylinder having oppositely disposed closed ends. In each of the closed ends, there is a central aperture which allows the carbon filament to pass into and out of the reactor on an uninterrupted basis. A mercury contact in each aperture allows that portion of the filament which is within the reactor to be raised in temperature by resistance heating. A number of ports in the sidewalls of the reactor tube allow chemicals to be injected into and withdrawn from the reactor chamber. Typically, a mixture of hydrogen and silanes are fed into the tubular cylinder. When the silanes come in contact with the heated filament core, a chemical vapor deposition process takes place and silicon carbide is deposited on the core.

DeBolt et al further teaches that it is advantageous to apply a surface layer of carbon-rich silicon carbide to the silicon carbide coating during the deposition process. The carbon-rich layer was shown to both improve tensile strength and decrease sensitivity to surface abrasion. The layer was approximately one micron thick and had a chemical composition which varied from pure carbon at the outer surface to silicon carbide at a depth of one micron. This carbon-rich coating both enhanced the strength of the filament and at the same time made the filaments easier to handle by the operator.

The carbon-rich filament of the DeBolt et al patent exhibits certain deficiencies. For example, when the filaments are fabricated into an aluminum composite, they do not wet easily in molten aluminum. Wetting can be accomplished at very high temperatures, but this degrades the strength of the filaments, presumably by chemical reaction between the aluminum and the carbonaceous surface. Aluminum alloys containing magnesium, nickel or titanium wet the filament at lower temperatures, but degrade their strength by chemical attack. In aluminum composites fabricated at lower temperatures, for example, by diffusion bonding, there is poor bonding between the filament and the matrix. In composites where the matrix material is titanium, the properties of the composite suffer because of mutually adverse interaction between the filament and the matrix. In matrix materials such as epoxy resins, it has also been difficult to provide good bonding between the carbonaceous surface and the resin.

With our invention, these problems are corrected. We apply a thin coating of silicon-rich silicon carbide to the silicon carbide substrate filament. The silicon-rich coating has a pure silicon exterior surface. The carbon silicon ratio C/Si increases as one proceeds into the interior of the coating and reaches stoichiometric proportion at or near the surface of silicon carbide substrate filament. The silicon coating simultaneously:

(a) reduces the notch sensitivity of SiC filament, thereby increasing the filament strength,
(b) provides a surface that is readily wet by molten aluminum alloys,
(c) provides a surface that is readily bonded to aluminum alloys during casting, diffusion bonding, or hot molding consolidation processes,
(d) provides a surface that prevents excessive interdiffusion between aluminum alloys and the SiC filament during fabrication or consolidation,
(e) provides a surface that can be transformed to $SiO_2$ for enhanced bonding in glass and resin matrices and enhanced reactivity towards coupling agents.

The silicon-rich coating is applied to a silicon carbide filament. The methods and conditions under which the coatings are applied are unique to this invention.

SUMMARY OF THE INVENTION

In the present invention, silicon-rich coatings are applied on silicon carbide filament by chemical vapor deposition. The silicon carbide filament may be produced by a deposition method of the type described by DeBolt et al. The silicon coatings are applied by passing the silicon carbide filament through a chemical vapor deposition reactor. The filament to be coated is passed through the reactor continuously from a feed reel to a take-up spool. That portion of the filament which is within the reactor is heated to an appropriate temperature somewhere between 1200° C. and 1350° C. Reactant gases are admitted to and passed through the reactor. Temperature and resident time of the filament within the reactor determines coating thickness. The silicon coatings may range in thickness from approximately 4 microns down to less than 0.5 micron. The optimum thickness may vary with the intended matrix material and with the composite fabrication procedure.

The novel features that are considered characteristic of the invention are set forth in the appended claims. The invention itself, however, both as to its organization and method of operation, together with additional objects and advantages thereof, will best be understood from the following description of a specific embodiment.

DESCRIPTION OF THE PREFERRED EMBODIMENT

Figure 1:
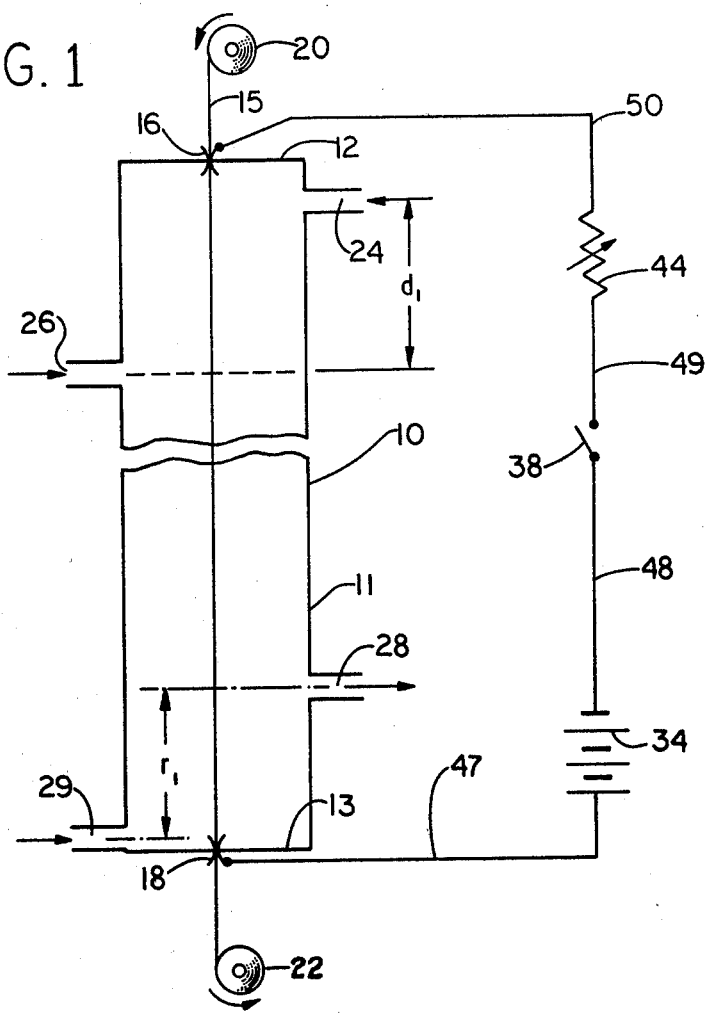
FIG. 1 is a schematic representation of a reactor for making silicon coated silicon carbide filament.

FIG. 1 shows in schematic form, a reactor 10 for depositing a silicon coating on a silicon carbide filament. A single-stage reactor is preferred and illustrated. It is plausible, however, to use two stages, as well. The reactor comprises a generally cylindrical member 11 having oppositely disposed closed ends 12 and 13. Filament core 15 is obtained from a supply reel 20. The carbonaceous core 15 passes into reactor 10 through a mercury contact 16 placed in an orifice in the center of end 12. The filament core passes entirely through the reactor exiting therefrom via mercury contact 18 in end 13. Take-up reel 22 stores the filament on which has been deposited the material supplied by the reactor.

In making silicon carbide filament according to the teaching of DeBolt et al (U.S. Pat. No. 4,068,037), the carbon core is prepared in a conventional way and fed to the reactor 10 as indicated in FIG. 1. At the top of the reactor at port 24, silane blend, hydrogen, argon and propane are fed to the reactor in quantities to deposit on the core 15 a carbon-rich silicon carbide layer. Some nitrogen and air are also added. At a distance $d_1$ below port 24, additional silane blend and hydrogen are added to dilute the mixture of gases in contact with the core 15 below the port 26.

Between the ports 24 and 26, the core 15 temperature is high and in the range of 1400° C. to 1500° C. Normal deposition temperatures, in the range of 1200° C. to 1350° C. are maintained below port 26.

Typically, reactor 10 might be 2.4 meters long between end 12 and end 13. The interior diameter of cylindrical member 11 could be 2 cm and the distance $d_1$ equal to 18 cm. Core travel of filament 15 is typically between 7.5 and 10 cm/sec.

The carbon core 15 entering reactor 10 through closed end 12 is raised to the desired deposition temperature by electrical resistance heating. One means of accomplishing this is shown in FIG. 1. Power to heat the filament is supplied preferably by a DC power supply 34. AC power or RF (radio frequency) power may also be used. Power supply 34 is encircuited by connecting lines 47, 48, 49 and 50 together with switch 38 and variable resistor 44. Connection with filament 15 is made via first mercury contact 16 and second mercury contact 18. By appropriate sizing of power supply 34 and adjustment of resistor 44, the deposition temperatures can be maintained in the 1200° C. to 1500° C. range stated above.

Figure 2:
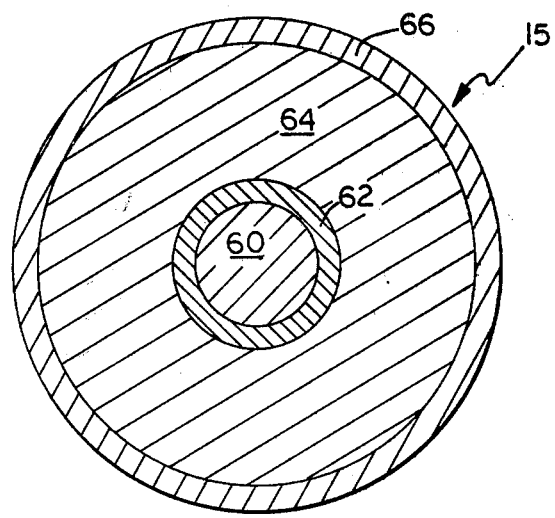
FIG. 2 is a cross-sectional representation of a silicon coated silicon carbide filament of the type made in the reactor of FIG. 1.

FIG. 2 shows a cross section of filament 15 as it is wound onto take-up reel 22. Cross-sectional area 60 represents the carbon core as it enters the reactor from supply reel 20. At the top of the reactor, between ports 24 and 26, the carbon-rich layer 62 is deposited on filament 15. Between ports 26 and 28, silicon carbide layer 64 is deposited. Between ports 28 and 29 silicon-rich layer 66 is added.

Deposition of the silicon-rich coating onto the filament as it passes through the region labeled $r_1$ is accomplished by passing a silicon containing gas into the reactor at port 29. In the system reduced to practice, a gas from the class of chlorosilanes $SiCl_nH_{(4-n)}$ was injected at port 29. Dichlorosilane is preferred. These gases produce a coating on the filament exiting the reactor at mercury contact 18 which grades in composition from pure silicon at the outermost surface to silicon carbide at the innermost surface. The innermost surface will be understood to refer to the interface between silicon carbide layer 64 and silicon coating 66 (See FIG. 2).

For the deposition of a silicon coating on silicon carbide, the temperature of the filament must be maintained between 1000° C. and 1350° C. Silicon melts at a temperature of 1417° C.

It will be understood that the thickness of silicon coating 66 can be controlled by the spacing between ports 29 and 28. A thin coating results when the spacing is small. A thicker coating results when the distance between ports 29 and 28 is increased. For a typical unit reduced to practice the spacing between ports 29 and 28 was set at 10 cm for the case where filament 15 moved through reactor 10 at a rate of 7.5 cm/sec.

Figure 3:
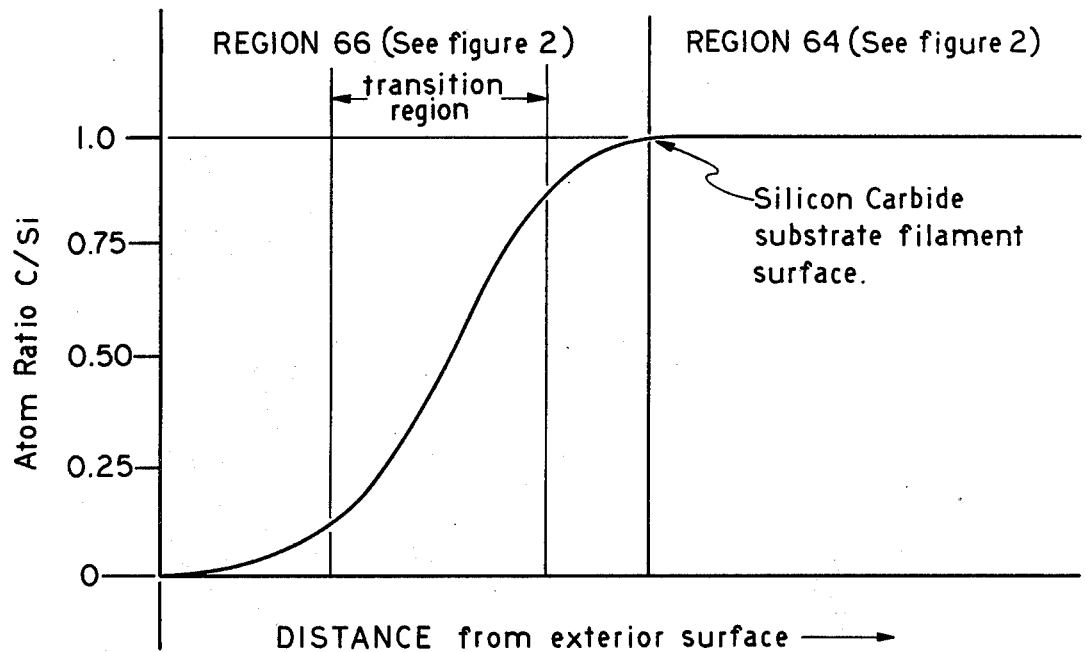
FIG. 3 is a plot of the carbon to silicon ratio of the coating as a function of distance from the exterior filament surface.

FIG. 3 depicts graphically and qualitatively the composition of the silicon-rich layer produced. The C/Si ratio of the silicon-rich layer starts out as one (the stoichiometric ratio) at the interface of the silicon carbide substrate surface and decreases as the layer is constructed and is essentially pure silicon at the exterior surface. The shape of the transition region between SiC and Si is not known at this time.

Figure 4:
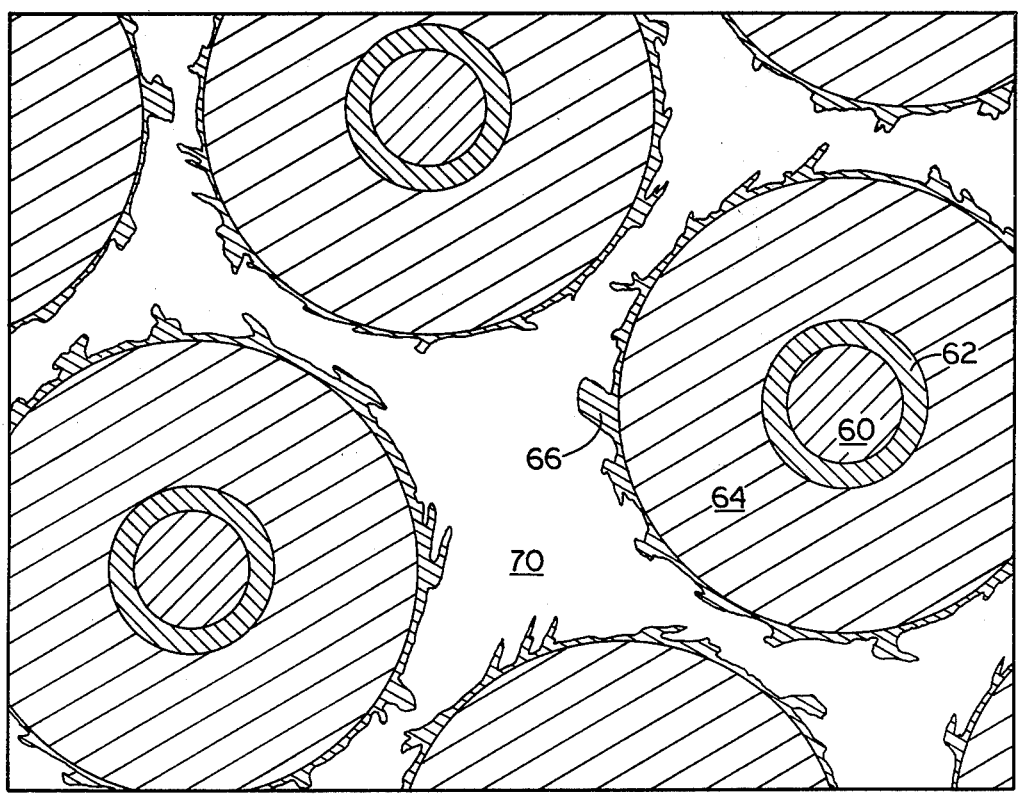
FIG. 4 is an artist's rendition of a photomicrograph of a cut made through an aluminum casting having silicon coated filaments embedded therein.

FIG. 4 shows an artist's rendition of a photomicrograph taken through several of the FIG. 2 filaments that had been molded into an aluminum casting. Specifically, area 70 of FIG. 4 represents an aluminum alloy such as A357 which has had cast therein a multiplicity of filaments each having a cross section such as is shown in FIG. 2. Study of FIG. 4 shows that silicon molecules within the aluminum alloy tend to preferentially nucleate onto the surface of the silicon carbide filaments. The result is that the silicon coating 66 of each filament is integrally bonded into the aluminum alloy. Bonding of the filaments to the aluminum alloy is thus greatly strengthened because of the partial precipitation of silicon from the metal alloy during the solidification process. This synergistic result produces composite materials having greatly improved performance parameters.

By precoating the silicon carbide filament with a material which is pure silicon at the surface, the filaments can be readily wetted by and bonded to either aluminum or aluminum alloys during casting, hot molding or diffusion bonding consolidation and fabrication processes.

In some usages of our invention, it may be advisable to use induction heating to maintain one or more portions of the reactor at the desired operating temperature. Also experience shows that introduction of argon gas into a particular section of the reactor can be used to raise the filament temperature therein and $H_2$ or He can be used to lower the filament temperature. Process parameters can be varied. Departures from the ratios expressed above may be compensated for by varying one or more parameters.

The features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims.

We claim:

1. A high strength, high modulus threadlike article useful in forming composite matrix structures comprising a silicon carbide substrate filament having applied thereto a thin coating of silicon-rich material wherein the ratio of C/Si varies from one (stoichiometric) at the interface of the substrate filament to zero (pure silicon) at the exterior surface.

2. The high strength, high-modulus threadlike article as described in claim 1 wherein the thickness of the thin coating of material measures between 0.5 and 4 microns.

3. A method of producing a silicon-rich coating on a silicon carbide filament substrate wherein the ratio of C/Si coating varies from one at the interface of the coating and filament to zero at the surface comprising the steps of:

vapor depositing silicon carbide on a filament substrate moving through a reactor; and adding a chlorosilane to the reactor downstream of where silicon carbide is deposited on the substrate and vapor depositing a silicon-rich silicon carbide coating from the chlorosilane on the silicon carbide deposit.

4. A method of producing a silicon-rich coating on a silicon carbide substrate as described in claim 3 wherein the deposition temperature is in the range of 1000° C. to 1350° C.

5. A method of producing a silicon-rich coating on a silicon carbide substrate as described in claim 4 wherein the chlorosilane is taken from the family $SiCl_nH_{(4-n)}$.

6. A method of producing a silicon-rich coating on a silicon carbide substrate as described in claim 5 wherein the chlorosilane is dichlorosilane.

* * * * *